(12) United States Patent　　(10) Patent No.:　　US 8,753,932 B2
Chang et al.　　(45) Date of Patent:　　Jun. 17, 2014

(54) ASYMMETRIC SILICON-ON-INSULATOR SRAM CELL

(75) Inventors: Leland Chang, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 13/430,067

(22) Filed: Mar. 26, 2012

(65) Prior Publication Data

US 2012/0190159 A1　　Jul. 26, 2012

Related U.S. Application Data

(63) Continuation of application No. 12/566,717, filed on Sep. 25, 2009, now Pat. No. 8,193,062.

(51) Int. Cl.
*H01L 21/8249* (2006.01)

(52) U.S. Cl.
USPC ................... 438/217; 438/276; 257/E21.024

(58) Field of Classification Search
USPC ........................... 438/217, 276; 257/E21.024
See application file for complete search history.

(56) References Cited

U.S. PATENT DOCUMENTS

| | | | |
|---|---|---|---|
| 5,348,903 A | 9/1994 | Pfiester et al. | |
| 5,354,703 A | 10/1994 | Gill | |
| 5,354,704 A | 10/1994 | Yang et al. | |
| 5,363,328 A | 11/1994 | Browning, III et al. | |
| 6,198,173 B1 * | 3/2001 | Huang | 257/536 |
| 6,466,489 B1 | 10/2002 | Ieong et al. | |
| 2001/0002711 A1 | 6/2001 | Gonzalez | |
| 2001/0018251 A1 | 8/2001 | Tran | |
| 2006/0240653 A1 | 10/2006 | Bhattacharyya | |
| 2006/0274569 A1 | 12/2006 | Joshi et al. | |
| 2007/0211519 A1 | 9/2007 | Thomas et al. | |
| 2007/0253239 A1 | 11/2007 | Wang et al. | |
| 2008/0175039 A1 | 7/2008 | Thomas et al. | |

OTHER PUBLICATIONS

Giraud et al., "In-depth Analysis of 4T SRAM Cells in Double-Gate CMOS", 1-4244-0757-5/07 2007 IEEE.
Giraud et al., "A Novel 4T Asymmetric Single-Ended SRAM Cell in sub-32 nm Double Gate Technology", 978-1-4244-1684-1/08 2008 IEEE.
Minal Sawant, "Single Event Effects Complicate Military Avionics Systems Design," http://www.cotsjournalonline.com/articles/view/102279, Jan. 2012.

* cited by examiner

*Primary Examiner* — Matthew Reames
(74) *Attorney, Agent, or Firm* — Canter Colburn LLP; Vazken Alexanian

(57) ABSTRACT

A memory cell having N transistors including at least one pair of access transistors, one pair of pull-down transistors, and one pair of pull-up transistors to form a memory cell, wherein N is an integer at least equal to six, wherein each of the access transistors and each of the pull-down transistors is a same one of an n-type or a p-type transistor, and each of the pull-up transistors is the other of an n-type or a p-type transistor, wherein at least one of the pair of the pull down transistors and the pair of the pull up transistors are asymmetric.

19 Claims, 6 Drawing Sheets

ASYMMETRIC SILICON-ON-INSULATOR SRAM CELL

CROSS-REFERENCE TO RELATED APPLICATIONS

This application is a continuation of U.S. patent application Ser. No. 12/566,717, filed Sep. 25, 2009, the disclosure of which is incorporated by reference herein in its entirety.

BACKGROUND

The present invention relates to semiconductor devices and integrated circuits, and more specifically, to static random access memory (SRAM) circuits embodied on a semiconductor device.

Silicon-on-insulator (SOI) devices offer several advantages over more conventional semiconductor devices. For example, SOI devices may have lower power consumption requirements than other types of devices that perform similar tasks. SOI devices may also have lower parasitic capacitances than non-SOI devices, which translates into faster switching times for the resulting circuits.

A drawback in some SOI circuits is the floating body effect. A floating body device/transistor is characterized in that there is (substantially) no effective electrical contact to the body/well of the device/transistor. The floating body effect is the effect of dependence of the body potential of a transistor realized by the silicon on insulator SOI technology on the history of its biasing and the carrier recombination processes. The transistor's body forms a capacitor against the insulated substrate. The charge accumulates on this capacitor and may cause adverse effects, for example, opening of parasitic transistors in the structure and causing off-state leakages, resulting in higher current consumption. It can also cause the above-noted history effect, the dependence of the threshold voltage of the transistor on its previous states. Due to the additional isolation of the SOI device, the body or well node is not typically contacted. In principal, body tie structures may be employed in SOI CMOS (complementary metal-oxide semiconductor) to add a contact to the floating body node, but this introduces parasitic resistances and capacitances as well as significant area penalties.

For many digital circuits, this impact can be neglected. However, the stability of certain circuits, such as the commonly used 6T SRAM (6 transistor static random access memory) cell, is degraded due to tolerance issues arising from the floating body. This is typically addressed by increasing the linear threshold voltage (Vt) of the FETs in the array, but this usually results in lowering the overall array performance.

In (SOI) technologies, there are many cases where electrical contact to the normally floating body region can be desirable. These cases include the mitigation of history effects in SOI and the enablement of low leakage SOI devices and/or high voltage SOI devices. There are many known solutions in the prior art. Almost all of these solutions typically have substantial density and parasitic penalties and many are not self-aligned. Many of them also consume a portion of the device's electrical width. For example, one of the earliest dual-sided Schottky body tie devices was formed by intentionally omitting dopant from a portion of the diffusion region. While effective, the cost of this approach is loss of device electrical width as well as poor gate control from low gate doping in the regions. A later prior art approach uses a Schottky body contact where the diffusion implants are angled in a manner to expose the source silicide to the body. This approach has drawbacks with the masking required and ground rule considerations on the angle that may be employed.

Floating body issues in SOI based SRAM are a critical concern for current and future technologies as they are an inherent source of variability. Severe variability issues threaten SRAM and array functionality unless properly addressed. SRAM design often involves a design tradeoff between stability and performance. While the floating body in SOI devices is beneficial to performance in certain uses, it also has negative impacts on stability and yield through increased variability.

FIG. 1 illustrates a conventional 6T-SRAM layout, with each transistor designated M: those labeled $M_2$ and $M_4$ are pull-up transistors, those labeled $M_1$ and $M_3$ are pull-down transistors, and those labeled $M_5$ and $M_6$ are pass gate or access transistors. Access to the SRAM cell is enabled by the word line (WL) which controls the two pass gate or access transistors $M_5$ and $M_6$ which, in turn, control whether the cell should be connected to the bit lines BL' and BL. They are used to transfer data for both read and write operations.

SUMMARY

Exemplary embodiments include a memory cell including N transistors including at least one pair of access transistors, one pair of pull-down transistors, and one pair of pull-up transistors to form a memory cell, wherein N is an integer at least equal to six, wherein each of the access transistors and each of the pull-down transistors is a same one of an n-type or a p-type transistor, and each of the pull-up transistors is the other of an n-type or a p-type transistor, wherein at least one of the pair of the pull down transistors and the pair of the pull up transistors are asymmetric.

Additional exemplary embodiments include a method of making a memory cell including doping a first region of a semiconductor substrate with at least one of an n-type and a p-type dopant and doping a second region of the semiconductor substrate with at least one of the n-type and the p-type dopant, forming over the first region a pair of symmetric access transistors, forming over the first region at least one pair of pull-down transistors that are at least one of symmetric and asymmetric, forming over the second region at least one pair of pull-up transistors that are at least one of symmetric and asymmetric and coupling the pair of pull-down transistors and the pair of pull-up transistors between the pair of access transistors to form a memory cell.

Further exemplary embodiments include a method of making a memory cell including forming a pair of access transistors over a first region of a semiconductor substrate, forming at least one pair of pull-down transistors over the first region, forming at least one pair of pull-up transistors over a second region of the semiconductor substrate, coupling the pair of pull-down transistors and the pair of pull-up transistors between the pair of access transistors to form a memory cell and performing a single sided halo implant on at least one of the pair of the pull-down transistors and the pair of the pull-up transistors, thereby fabricating an asymmetry in the at least one of the pair of the pull-down transistors and the pair of the pull-up transistors Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the asymmetric SOI SRAM cell structure addresses the variability problems due to the floating body nodes as described above. In exemplary embodiments, selective implementation of asymmetric devices lessens the floating body impact while retaining performance. In one example, implementing asymmetric devices in the four transistors of the two inverters of the SOI SRAM engineer a lower floating body potential. Conventional techniques, such as mapping the SRAM devices to either fully deplete undoped devices or bulk CMOS devices, present process complexity and cost if they need to be built in the same silicon wafer as high performance planar SOI FETs in logic. Furthermore, in a SOI FET, in addition to conduction through the channel under the gate, there is also a path from the drain diffusion to the floating body (N type in the drain, P type in the body for an NFET), which is a diode. Similarly, there is a diode connecting the body node to the source diffusion node. This configuration results in two diodes in series (but 'back to back', i.e., one operates in a forward mode, one in a reverse mode, assuming a positive bias on the floating body, and the body is P type and both diffusion nodes are N type [for an NFET example]). In typical floating body SOI, reverse leakage from the drain diffusion to body diode raises the body voltage, as the drain is connected to $V_{dd}$ in an NFET. As this event happens, the body node potential with increase, as it's not grounded as in bulk. Eventually, the diode from the body to source turns on, as it's forward biased, limiting the body potential typically to on the order of ~300-400 mV. In a body tied SOI device, the body node is either explicitly grounded in some fashion, which effectively overrides the 'floating' effect and the impact of the drain diode reverse leakage.

In exemplary embodiments, in asymmetric SOI FETs, the emphasis of the halo implant can be primarily into the source side of the device results, which in a different body to source diode. Higher doping on the source side reduces the turn-on voltage of the diode, which in turn limits the floating body voltage to something on the order of 0-100 mV.

In exemplary embodiments, selected devices can be mapped to asymmetric devices in the SRAM cell to lower floating body variability without the additional cost and complexity. As such, some gates are kept asymmetric (i.e., the pass gates) for both floating body performance and the others asymmetric for variability reduction and stability. In exemplary embodiments, by implementing masking and implants, halo implants can be performed on one side (e.g., the source side) of selective FETs. As such, masking techniques can be implemented, which do not require body tie formation or complex integration of alternate device silicon thicknesses).

Figure 1:
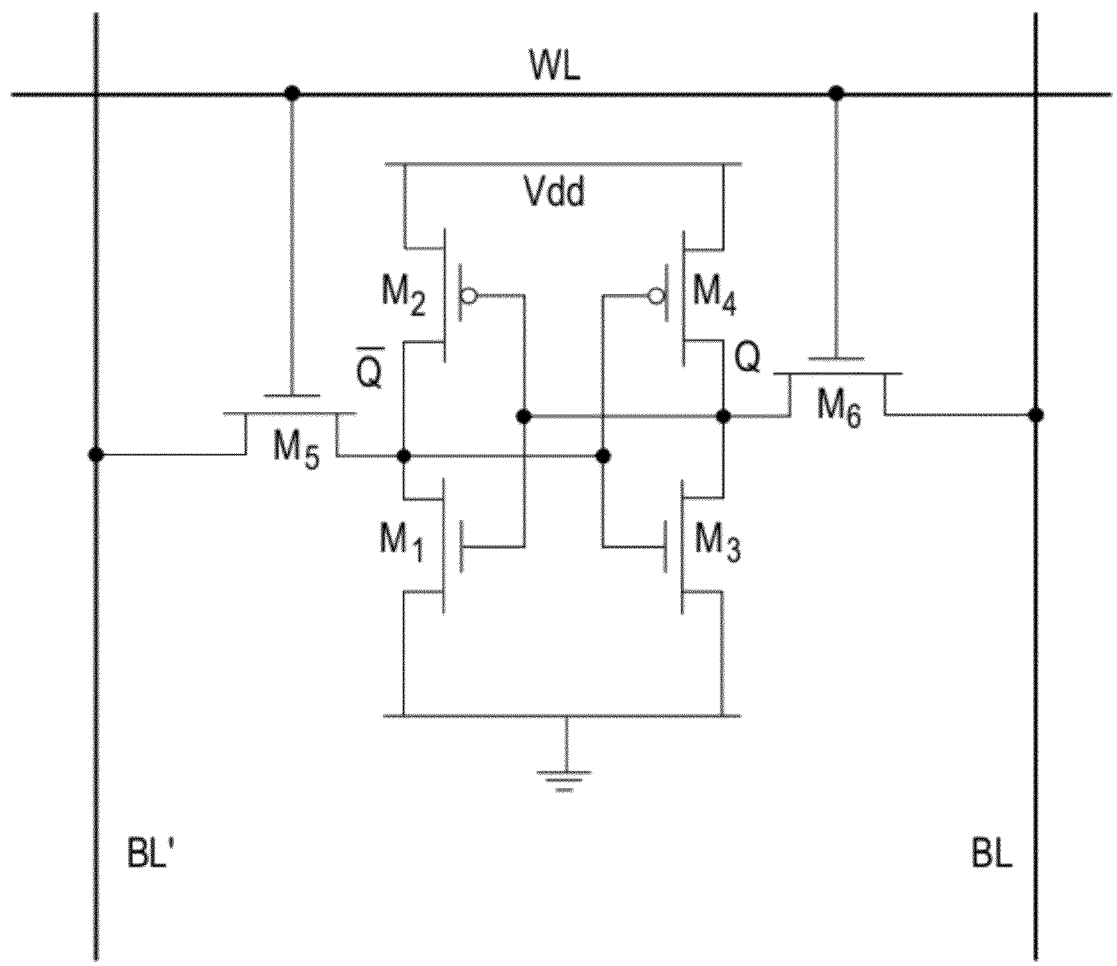
FIG. 1 illustrates a prior art schematic of a 6TSRAM cell.
Figure 2:
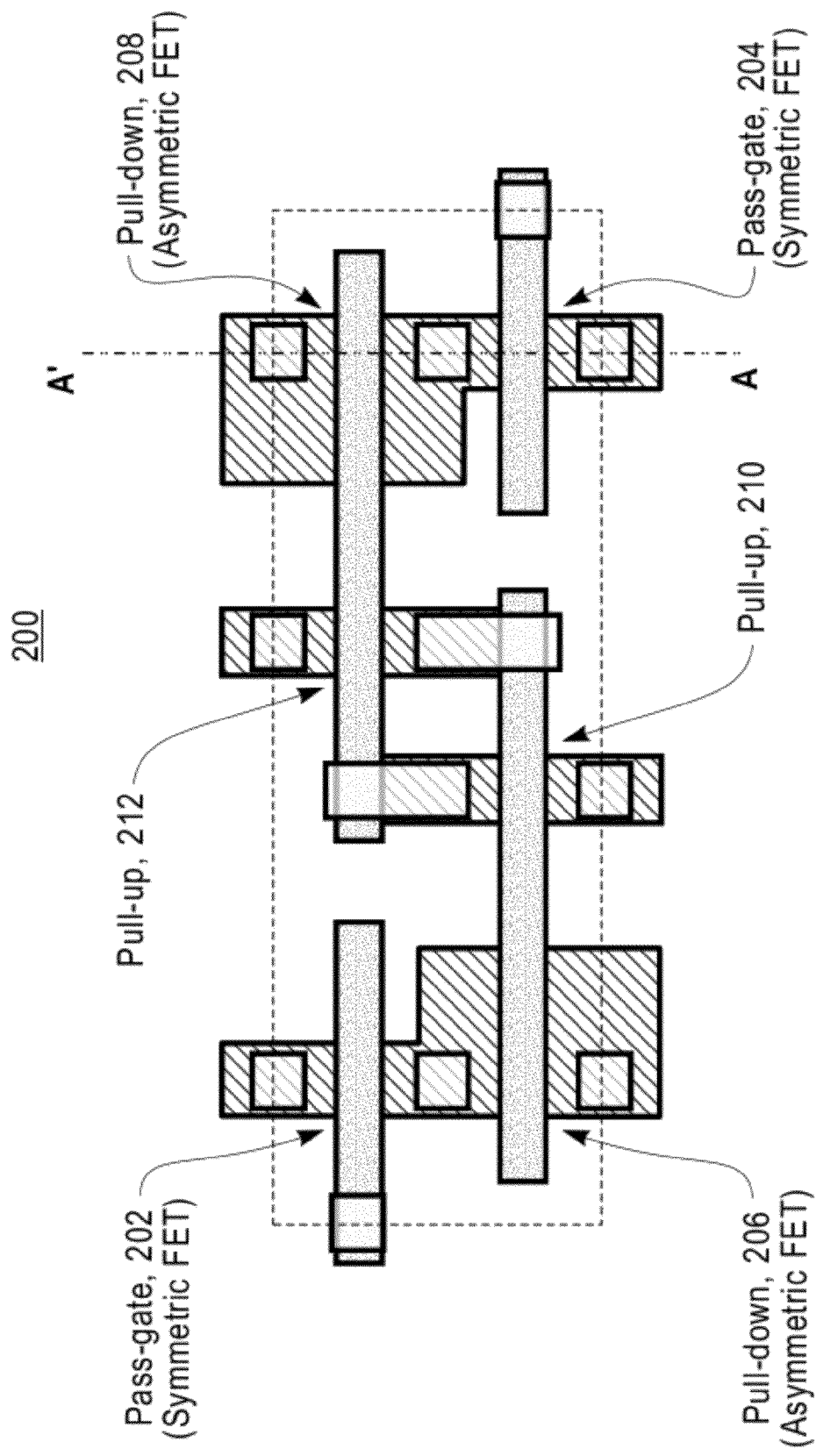
FIG. 2 illustrates a top view of an exemplary 6T SRAM cell in accordance with exemplary embodiments.

FIG. 2 illustrates a plan view of an exemplary 6T SRAM cell 200. Access transistors 202, 204 can be n-FET pass gate symmetric FET devices, whereas at least a pair of pull-down transistors 206, 208 disposed between the access transistors 202, 204 are asymmetric FET devices. In exemplary embodiments, there can be at least one pair of pull-up transistors 210, 212, which can be either floating body or non-floating body devices, disposed between the access transistors 202, 204 and pull-down transistors 206, 208. In exemplary embodiments, the pull-up devices 210, 212 are fabricated over an n-doped well, and are p-FETs, whereas the other transistors are n-FETs.

In exemplary embodiments, several mask steps can be implemented to achieve the halo implants as described above. In one example, to achieve either NFET or PFET halos, several mask steps can be implemented. Four masks can first be implemented to expose the devices selected to asymmetric devices. In the exemplary embodiments described herein, the pull-down transistors 206, 208 are selected to be the asymmetric devices. As such, one mask is used for each of the "source up" (the sources oriented up on the wafer) regions of the pull-down transistors 206, 208, and one mask is used for each of the "source down" (the source oriented down on the wafer) regions. The four masks are used for both the NFET and PFET halos.

Figure 3:
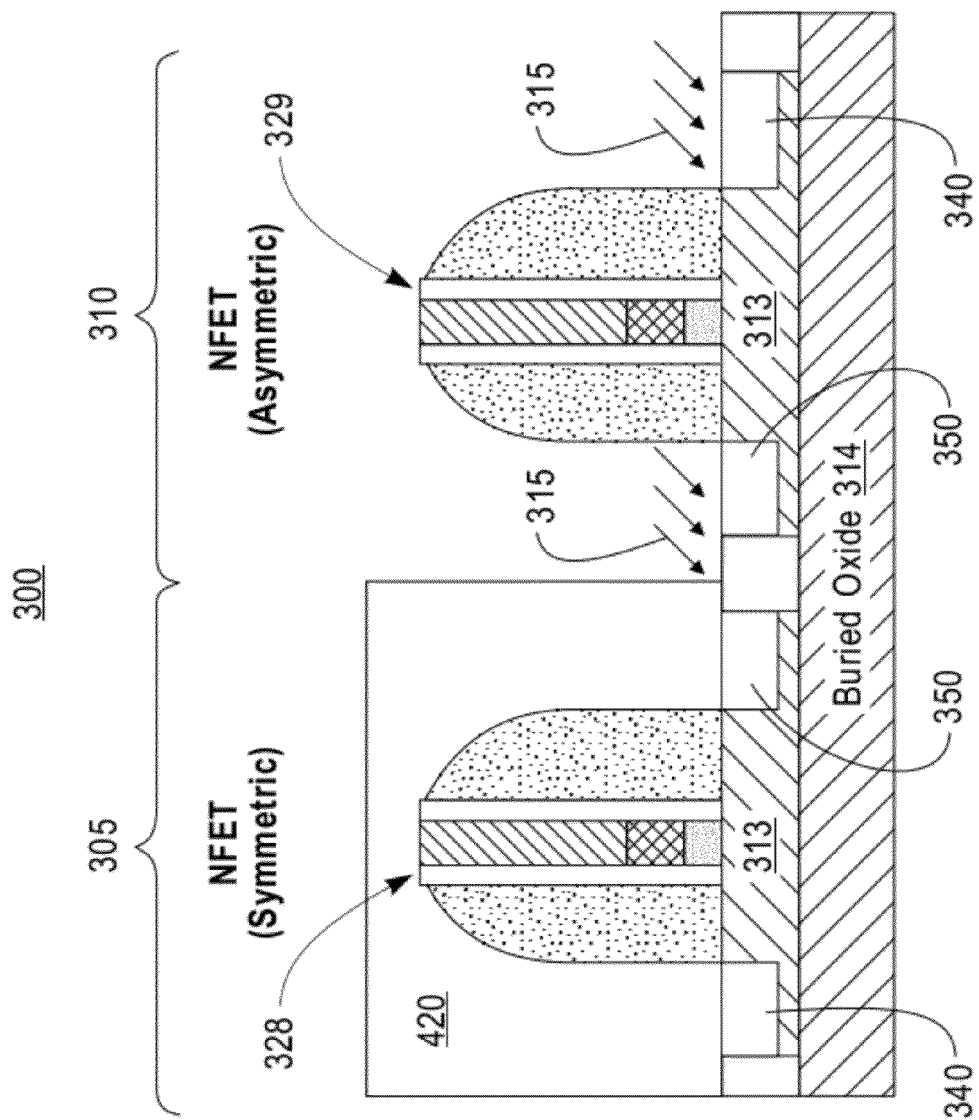
FIG. 3 illustrates a side structural view of an example of an asymmetric NFET undergoing a halo implant in accordance with exemplary embodiments.
Figure 4:
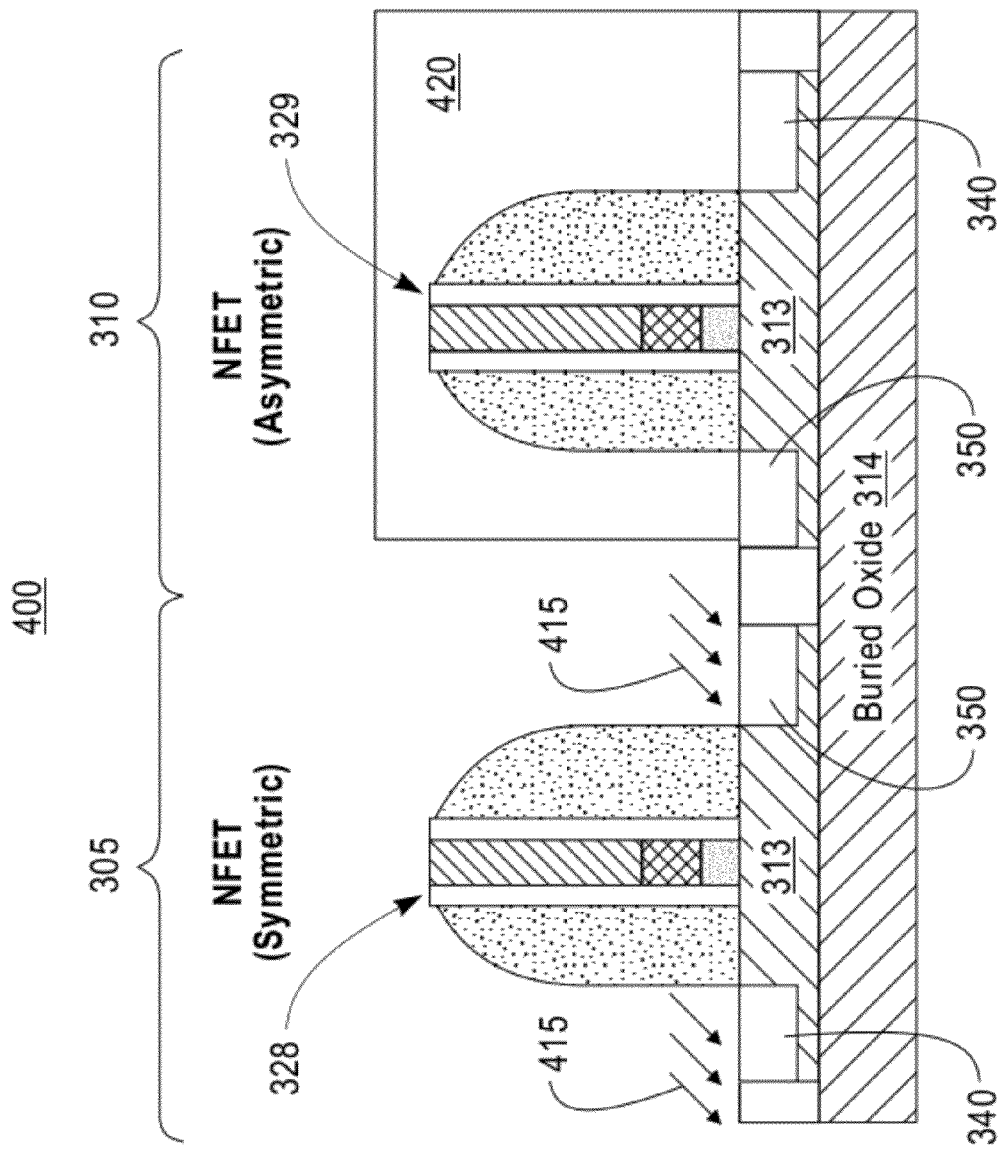
FIG. 4 illustrates a side structural view of an example of a symmetric NFET undergoing a halo implant in accordance with exemplary embodiments.

FIG. 3 illustrates a side structural view of an example of an asymmetric NFET 300 undergoing a halo implant in accordance with exemplary embodiments. FIG. 4 illustrates further details of the region shown in FIG. 2. In exemplary embodiments, a gate 328 of the symmetric access transistor 202, 204 is disposed over a semiconductor layer 313. In addition, a gate 329 of the asymmetric pull-down transistor 206, 208 is disposed over the semiconductor layer 313. The semiconductor layer 313 can be disposed over a layer of buried oxide 314. The asymmetric NFET 300 can further include source and diffusion regions 340, 350. In exemplary embodiments halo implants are selectively performed to reduce the overall floating body impact. In exemplary embodiments, selected gates have halo implants performed on only one side, such as the source region 340. The resulting asymmetry generates a larger body to source leakage, and reduces both the magnitude and full swing of the floating body potential, which clamps the swing of the floating body potential to a lower value. As such, in the exemplary embodiments described herein, the asymmetric devices are designed and fabricated to have a lower floating body effect than the symmetric devices.

The masking steps as described herein block the symmetric transistor 305 with resist 320 and expose the asymmetric transistor 310 to prepare it for the implant. In exemplary embodiments, standard masking, photolithography and implanting techniques are performed. As illustrated, a single-sided implant 315 is performed on one side of the asymmetric transistor 310, thereby generating a first single sided halo implant. In exemplary embodiments, the single-sided halo implant 315 is performed on one side at either 0 or 180 degrees depending on the source orientation of the wafer. As described herein the single sided halo implant 315 lowers the floating body potential in the off state (i.e., $Vb_{off}$).

Figure 5:
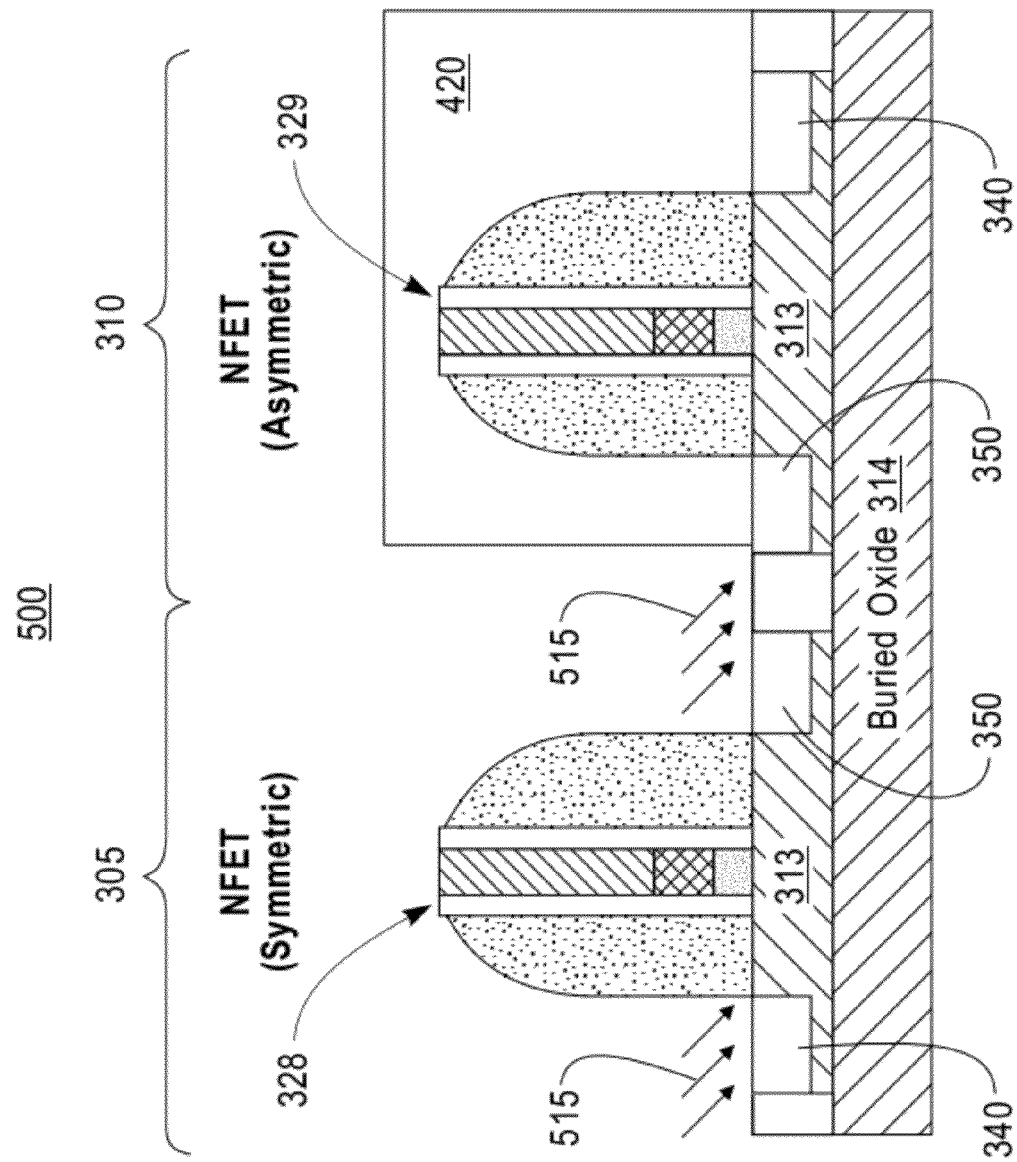
FIG. 5 illustrates a side structural view of an example of a symmetric NFET undergoing a halo implant in accordance with exemplary embodiments.

In exemplary embodiments, as described herein, additional halo implants are performed on the symmetric transistor 305. In exemplary embodiments, the halo implants for the symmetric transistor 305 are conventionally implemented with 0 d/180 d (dual) symmetric halo implants. FIG. 4 illustrates a side structural view of an example of a symmetric NFET 400 undergoing a halo implant in accordance with exemplary embodiments. FIG. 4 illustrates that the asymmetric device 310 is covered with resist 420. As discussed herein, standard masking, photolithography and implanting techniques are performed. As illustrated, a first of the dual sided halo implant 415 is performed on one side of the symmetric transistor 305, thereby generating a first of the dual-sided halo implant. FIG. 5 illustrates a side structural view of an example of a symmetric NFET 500 undergoing a halo implant in accordance with exemplary embodiments. FIG. 5 illustrates that the asymmetric device 310 is covered with resist 520. As discussed herein, standard masking, photolithography and implanting techniques are performed. As illustrated, a second of the dual sided halo implant 515 is performed on one side of the symmetric transistor 305, thereby generating the second of the dual-sided halo implant. In exemplary embodiments, standard fabrication techniques can be performed to generate the devices (e.g., conventional bulk SOI devices) as described herein.

Figure 6:
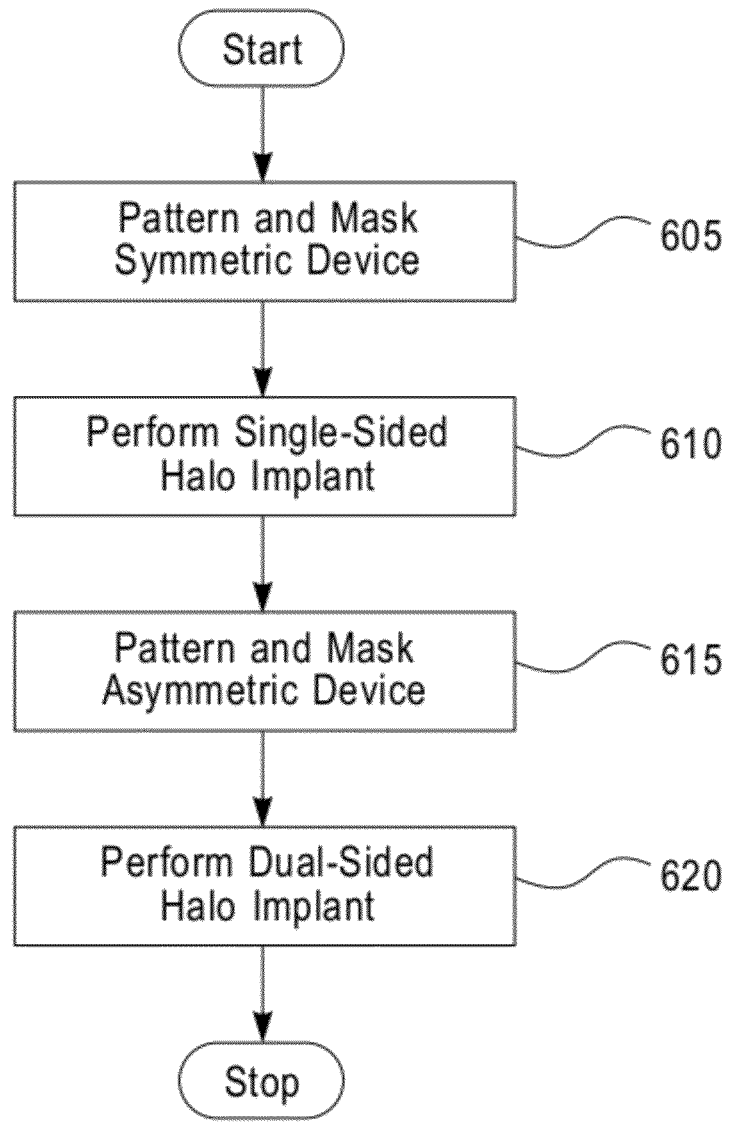
FIG. 6 illustrates a flow chart of a method for fabricating an asymmetric SOI SRAM cell in accordance with exemplary embodiments.

FIG. 6 illustrates a flow chart of a method 600 for fabricating an asymmetric SOI SRAM cell in accordance with exemplary embodiments. The exemplary masking and halo implantation techniques for fabricating the symmetric and asymmetric devices are described in the method 600. At block 605, the masking and patterning of the symmetric device 305 is performed. At block 610, the single-sided halo implant (see the single-sided halo implant 315 in FIG. 3) is performed, which provides the asymmetry as described herein. As described herein the first halo implant can be directed at either 0 degrees or 180 degrees depending on the orientation of the wafer. At block 615, the masking and patterning of the asymmetric device 310 is then performed. It is appreciated that the asymmetric device includes only one halo implant 315, and is subsequently masked, thus creating the asymmetry as described herein. At block 620, the dual-sided halo implant is performed, which provides the symmetry as described herein (see the first and second of the dual sided halo implants 415, 515 in FIGS. 4 and 5 respectively). As described herein the dual sided halo implants 415, 515 are conventional dual (0 d/180 d) halo implants.

As described herein, the SOI devices described herein can be fabricated with conventional fabrication techniques. For example, the method 600 can include doping a first region of a semiconductor substrate with at least one of an n-type and a p-type dopant and doping a second region of the semiconductor substrate with at least one of the n-type and the p-type dopant, and forming a pair of symmetric access transistors over the first region. The method 600 can further include forming at least one pair of pull-down transistors that are at least one of symmetric and asymmetric over the first region and forming at least one pair of pull-up transistors that are symmetric or asymmetric over the second region. In addition, the method 600 can further include coupling the pair of pull-down transistors and the pair of pull-up transistors between the pair of access transistors to form a memory cell. The memory cell described herein can include a static random access memory cell. As such, the coupling of the pair of pull-down transistors and the pair of pull-up transistors between the pair of access transistors can be performed by coupling each gate of the pull-down transistors and each gate of the pull-up transistors to a channel of at least one of the access transistors.

As described herein, in a standard 6T-SRAM layout, with $M_2$ and $M_4$ as pull-up transistors, $M_1$ and $M_3$ as pull-down transistors, and $M_5$ and $M_6$ as pass gate or access transistors. In the embodiments described herein, various combinations of the symmetric and asymmetric transistors are contemplated. In exemplary embodiments, the $M_1$ and $M_3$ are asymmetric. In exemplary embodiments, $M_2$ and $M_4$ can be asymmetric. In exemplary embodiments, $M_1/M_3/M_2/M_4$ are asymmetric. In exemplary embodiments, $M_5$ and $M_6$ are symmetric in the embodiments described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of making a memory cell comprising:
   forming a pair of access transistors over a first region of a semiconductor substrate, the first region being at least one of an n-type and a p-type dopant;
   forming a pair of pull-down transistors over the first region;
   forming a pair of pull-up transistors over a second region of the semiconductor substrate, the second region being at least one of the n-type and p-type dopant;
   coupling the pair of pull-down transistors and the pair of pull-up transistors between the pair of access transistors to form a memory cell;

performing a single sided halo implant on at least one of the pair of the pull-down transistors and the pair of the pull-up transistors, the single sided halo implant providing asymmetry to the memory cell; and performing a dual-sided halo implant on the access transistors, the duel-sided halo implant providing symmetry to the memory cell.

2. The method as claimed in claim 1 wherein the single sided halo implant fabricates an asymmetry in the at least one of the pair of the pull-down transistors and the pair of the pull-up transistors.

3. The method as claimed in claim 1 wherein the dual sided halo implant on the access transistors fabricates a symmetry in the pair of access transistors.

4. The method as claimed in claim 1 wherein each of the access transistors and each of the pull-down transistors is a same one of an n-type or a p-type transistor, and each of the pull-up transistors is the other of an n-type or a p-type transistor.

5. The method as claimed in claim 1 wherein the access transistors are symmetric.

6. The method as claimed in claim 1 wherein the pair of pull-down transistors is asymmetric.

7. The method as claimed in claim 1 wherein the pair of pull-up transistors is asymmetric.

8. The method as claimed in claim 1 wherein the pair of pull-down transistors and the pair of pull-up transistors are asymmetric.

9. The method of claim 1, wherein each of the access transistors and each of the pull-down transistors is an n-type transistor.

10. The method as claimed in claim 9 wherein each of the pull-up transistors is a p-type transistor.

11. The method as claimed in claim 1, wherein the memory cell includes a static random access memory cell.

12. The method as claimed in claim 11 wherein each of the pull-up and pull-down transistors include a gate coupled to a channel of at least one of the access transistors.

13. A method of making a memory cell comprising:
forming a pair of access transistors over a first region of a semiconductor substrate, the first region being at least one of an n-type and a p-type dopant;
forming a pair of pull-down transistors over the first region;
forming a pair of pull-up transistors over a second region of the semiconductor substrate, the second region being at least one of the n-type and p-type dopant;
coupling the pair of pull-down transistors and the pair of pull-up transistors between the pair of access transistors to form a memory cell;
performing an asymmetric single sided halo implant on at least one of the pair of the pull-down transistors and the pair of the pull-up transistors; and
performing a symmetric dual sided halo implant on at least one of the pair of pull-down transistors and the pair of the pull-up transistors.

14. The method as claimed in claim 13 wherein the single sided halo implant fabricates an asymmetry in the at least one of the pair of the pull-down transistors and the pair of the pull-up transistors.

15. The method as claimed in claim 14 further comprising performing a dual-sided halo implant on the access transistors.

16. The method as claimed in claim 15 wherein the dual sided halo implant on the access transistors fabricates a symmetry in the pair of access transistors.

17. A method of making a memory cell comprising:
forming a pair of access transistors over a first region of a semiconductor substrate, the first region being at least one of an n-type and a p-type dopant;
forming a pair of pull-down transistors over the first region;
forming a pair of pull-up transistors over a second region of the semiconductor substrate, the second region being at least one of the n-type and p-type dopant;
coupling the pair of pull-down transistors and the pair of pull-up transistors between the pair of access transistors to form a memory cell;
performing an asymmetric single sided halo implant on at least one of the pair of the pull-down transistors and the pair of the pull-up transistors; and
performing a symmetric dual-sided halo implant on the access transistors,
wherein each of the access transistors and each of the pull-down transistors is a same one of an n-type or a p-type transistor, and each of the pull-up transistors is the other of an n-type or a p-type transistor.

18. The method as claimed in claim 17 wherein the single sided halo implant fabricates an asymmetry in the at least one of the pair of the pull-down transistors and the pair of the pull-up transistors.

19. The method as claimed in claim 17 wherein the dual sided halo implant on the access transistors fabricates a symmetry in the pair of access transistors.

* * * * *